(12) United States Patent
Nozawa et al.

(10) Patent No.: US 11,483,924 B2
(45) Date of Patent: Oct. 25, 2022

(54) SUBSTRATE SUPPORT STRUCTURE AND METHOD OF FORMING THE SAME

(71) Applicant: Yazaki Corporation, Tokyo (JP)

(72) Inventors: Keitaroh Nozawa, Shizuoka (JP); Hidehiko Shimizu, Shizuoka (JP); Shinji Kawai, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 17/318,111

(22) Filed: May 12, 2021

(65) Prior Publication Data

US 2021/0360769 A1 Nov. 18, 2021

(30) Foreign Application Priority Data

May 15, 2020 (JP) .............................. JP2020-085807

(51) Int. Cl.
*H05K 1/02* (2006.01)

(52) U.S. Cl.
CPC ... *H05K 1/028* (2013.01); *H05K 2201/09063* (2013.01)

(58) Field of Classification Search
CPC ........ H05K 1/028; H05K 1/0281; H05K 1/11; H05K 1/118; H05K 1/18; H05K 1/181; H05K 2201/09063; H05K 2201/09045; H05K 2201/09563; H05K 2201/09827; H05K 2201/10295; H05K 2201/09909; H05K 2201/2009; H05K 2201/2072
See application file for complete search history.

(56) References Cited

U.S. PATENT DOCUMENTS

2012/0160543 A1* 6/2012 Nakanishi ............ H05K 3/0064
                                                                174/250
2018/0244017 A1* 8/2018 Ajisaka ................. B32B 15/088

FOREIGN PATENT DOCUMENTS

| DE | 102017010291 A1 * | 5/2018 | ............. B29C 65/02 |
| DE | 102017010291 A1 * | 5/2018 | ............. B29C 65/02 |
| JP | 61-112990 A       | 5/1986 | |
| JP | 2000245034 A *    | 9/2000 | ........... H01R 9/2466 |
| JP | 2011-254001 A     | 12/2011 | |
| JP | 2011254001 A *    | 12/2011 | |
| JP | 6332118 B2 *      | 5/2018 | ........... H05K 1/0215 |

(Continued)

OTHER PUBLICATIONS

DE 102017010291 A1 (Translation) (Year: 2022).*

(Continued)

*Primary Examiner* — Hoa C Nguyen
*Assistant Examiner* — John B Freal
(74) *Attorney, Agent, or Firm* — Sughrue Mion, PLLC (57) ABSTRACT

A substrate support structure includes: a substrate support including: a support body; and a protrusion including a base portion and a leading-end portion, the protrusion protruding from the support body; and a substrate having: a substrate body; a through hole provided at the substrate body; and a protruded portion surrounding the through hole, the protruded portion protruding from a first face of the substrate body, in which the base portion of the protrusion passes through the through hole, and the leading-end portion protrudes from the first face of the substrate body inside the protruded portion and engages with the substrate body such that the through hole is covered.

4 Claims, 6 Drawing Sheets

(56) References Cited

FOREIGN PATENT DOCUMENTS

JP         6332118 B2    5/2018
JP     2018-137317 A    8/2018

OTHER PUBLICATIONS

JP 2011/254001 A (Translation) (Year: 2022).*
JP 2000/245034 A (Translation) (Year: 2022).*
JP 6332118 B2 (Translation) (Year: 2022).*

* cited by examiner

SUBSTRATE SUPPORT STRUCTURE AND METHOD OF FORMING THE SAME

CROSS-REFERENCE TO RELATED APPLICATIONS

The present application is based on, and claims priority from Japanese Patent Application No. 2020-085807, filed on May 15, 2020, the entire contents of which are incorporated herein by reference.

TECHNICAL FIELD

The present application relates to a substrate support structure and a method of forming the substrate support structure.

BACKGROUND

JP 2018-137317 A discloses a method of securing with a screw as a method of securing, to a case (substrate support), an electronic control board (substrate) that monitors a lithium-ion battery mounted on, for example, an electric vehicle (EV).

In order to fix the substrate to the case, the above method includes heating a leading end that belongs to a protrusion (boss portion) provided at the case and protrudes from the substrate, to caulk the leading end.

SUMMARY

However, a method of heating the leading end of a protrusion protruding from a substrate to caulk the leading end is likely to have adverse influence on a wiring pattern or electronic components provided on the substrate if the thermally melted leading end spreads unnecessarily on the surface of the substrate.

An object of the present application is to provide a substrate support structure in which a substrate is fixed to a substrate support by a leading-end portion resulting from the leading end of a protrusion of the substrate support subjected to softening, for example, by melting and then subjected to hardening, the substrate support structure enabling prevention of the softened leading end of the protrusion from spreading unnecessarily on the surface of the substrate.

An object of the present application is to provide a method of forming a substrate support structure, the method including subjecting the leading end of a protrusion of a substrate support to softening, for example, by melting and then to hardening, to fix a substrate to the substrate support, the method enabling prevention of the softened leading end of the protrusion from spreading unnecessarily on the surface of the substrate.

A substrate support structure according to an embodiment includes: a substrate support including: a support body; and a protrusion including a base portion and a leading-end portion larger in outer diameter than the base portion, the protrusion protruding from the support body; and a substrate having: a substrate body; a through hole provided at the substrate body; and a protruded portion surrounding the through hole, the protruded portion protruding from a first face that is one face in a thickness direction of the substrate body, in which the base portion of the protrusion passes through the through hole, and the leading-end portion of the protrusion protrudes from the first face of the substrate body inside the protruded portion and engages with the substrate body such that the through hole is covered.

In the substrate support structure according to the embodiment, the substrate is thinly tabular in shape and has flexibility.

In the substrate support structure according to the embodiment, a second face that is another face in the thickness direction of the substrate body is in contact with a face of the support body from which the protrusion protrudes.

In the substrate support structure according to the embodiment, the protruded portion is formed of at least any of a resist provided to the substrate body, a coverlay provided to the substrate body, solder provided to the substrate body, part of a wiring pattern provided to the substrate body, and a washer provided to the substrate body.

A method of forming a substrate support structure according to an embodiment, includes: a substrate temporary fixing process of temporarily fixing a substrate having a substrate body, a through hole provided at the substrate body, and a protruded portion surrounding the through hole and protruding from a first face that is one face in a thickness direction of the substrate body, to a substrate support including a support body and a protrusion protruding from the support body such that a second face that is another face in the thickness direction of the substrate body faces the substrate support and the protrusion passes through the through hole; and a protruding leading-end forming process of deforming, by softening and then by hardening, a leading end of the protrusion protruding from the through hole due to the substrate temporary fixing process such that the leading end of the protrusion covers the through hole and fits inside the protruded portion, to fix the substrate to the substrate support.

According to the corresponding embodiment, due to the substrate support structure in which the substrate is fixed to the substrate support by the leading-end portion resulting from the leading end of the substrate support subjected to softening, for example, by melting and then subjected to hardening, the softened leading end of the protrusion can be prevented from spreading unnecessarily on the surface of the substrate.

According to the corresponding embodiment, due to the method of forming the substrate support structure, the method including subjecting the leading end of the protrusion of the substrate support to softening, for example, by melting and then to hardening, the softened leading end of the protrusion can be prevented from spreading unnecessarily on the surface of the substrate.

DETAILED DESCRIPTION

Various embodiments will be described hereinafter with reference to the accompanying drawings.

Figure 1:
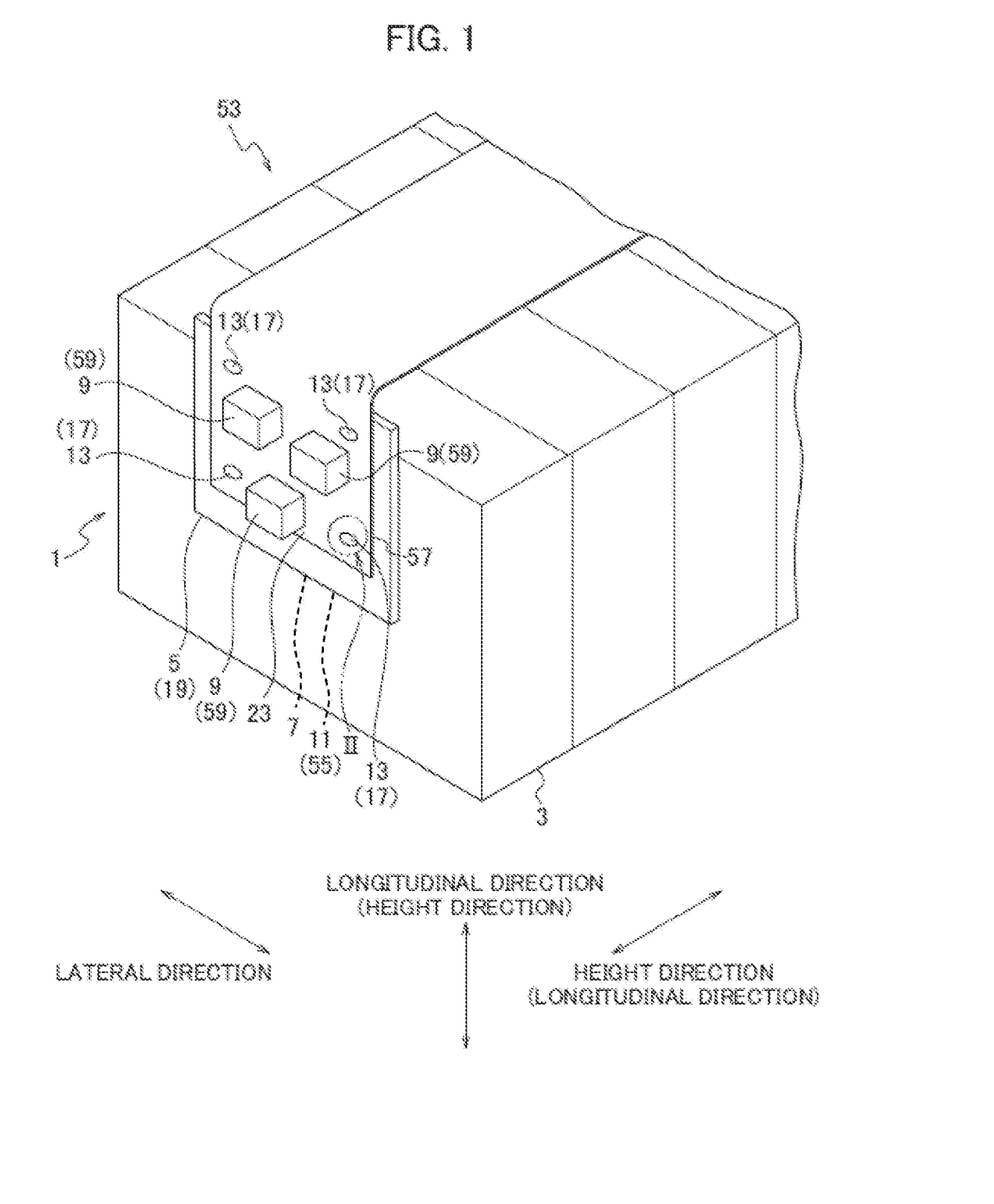
FIG. 1 is a perspective view of a substrate support structure according to an embodiment of the present application, in exemplary use.

As illustrated in FIG. 1, a substrate support structure 1 according to an embodiment of the present application is used in order to secure a substrate (electronic control board) 5 that monitors a lithium-ion battery 3 mounted on, for example, an electric vehicle (EV), to a substrate support 7. The substrate support structure 1 includes the substrate support 7 and the substrate 5. The substrate 5 is provided with electronic components 9 and a wiring pattern not illustrated.

For convenience of description, a predetermined direction is defined as the longitudinal direction. Another predetermined direction orthogonal to the longitudinal direction is defined as the lateral direction. A direction orthogonal to the longitudinal direction and the lateral direction is defined as the height direction. Note that the height direction is not necessarily identical to the up-and-down direction.

Figure 2A:
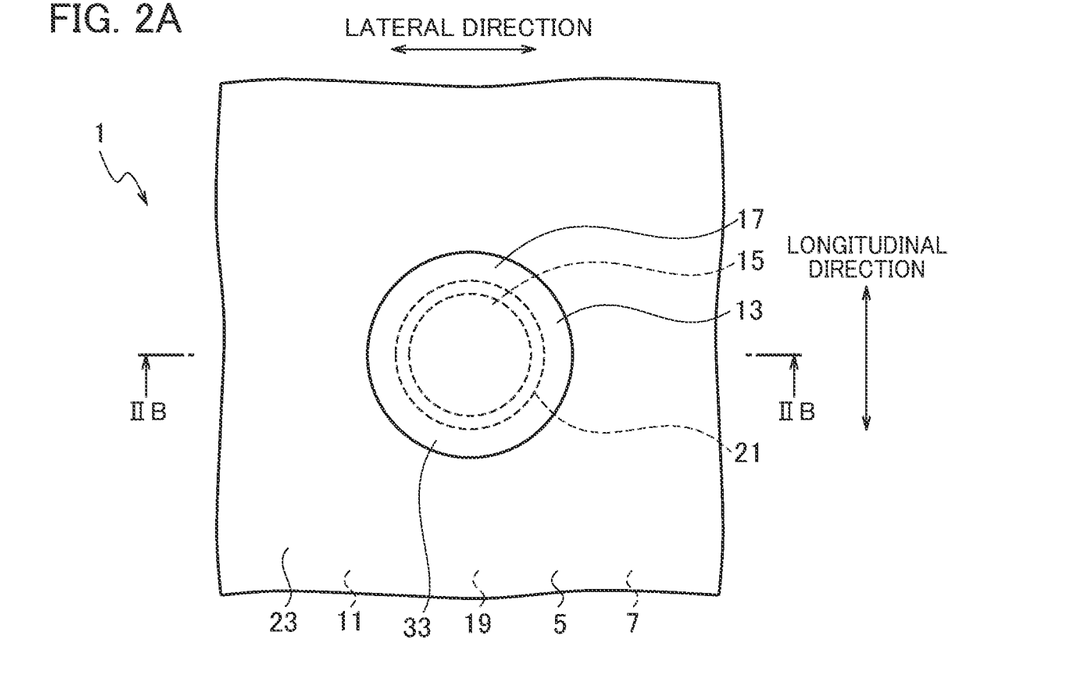
FIG. 2A is an enlarged view of part II of FIG. 1 and illustrates part II viewed in the height direction.
Figure 2B:
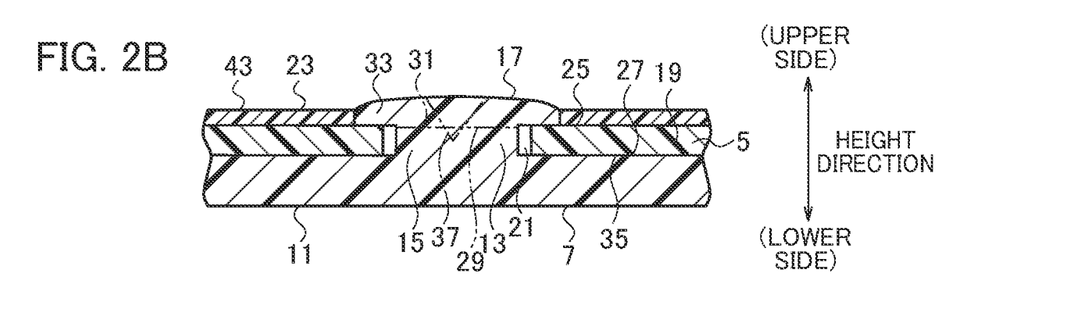
FIG. 2B is a sectional view taken along line IIB-IIB of FIG. 2A.

As illustrated in FIGS. 2A and 2B, the substrate support 7 includes a support body 11 and a protrusion (boss portion) 13. The protrusion 13 includes a base portion 15 and a leading-end portion 17, and protrudes upward in the height direction from the support body 11. The leading-end portion 17 is larger in outer diameter than the base portion 15. For example, the substrate support 7 is integrally molded out of thermoplastic resin.

The substrate 5 includes a substrate body 19. The substrate body 19 is provided with a through hole 21 and a protruded portion (wall portion or surrounding wall portion) 23. The protruded portion 23 surrounds the through hole 21 and slightly protrudes upward in the height direction from a first face (upper face) 25 that is one face in the thickness direction of the substrate body 19.

In the substrate support structure 1, the base portion 15 of the protrusion 13 passes in the height direction through the through hole 21. Inside the protruded portion 23, the leading-end portion 17 of the protrusion 13 slightly protrudes upward in the height direction from the first face (upper face) 25 of the substrate body 19. The leading-end portion 17 of the protrusion 13 covers the outer edge of the through hole 21 and engages with the substrate body 19.

In addition, the support body 11 is, for example, tabular in shape. The protrusion 13 protrudes from a first face (upper face) 27 that is one face in the thickness direction of the support body 11 tabular in shape. The base portion 15 of the protrusion 13 is, for example, pillar-shaped, such as columnar in shape. The height direction of the base portion 15 is identical to the thickness direction of the support body 11, and the directions thereof are identical to the height direction.

The leading-end portion 17 of the protrusion 13 is, for example, spherical-cap-shaped. A spherical cap is the solid smaller in volume in two solids resulting from a sphere divided into two by a plane not passing through the center of the sphere. The leading-end portion 17, which is spherical-cap shaped, is identical in height direction to the base portion 15.

Note that the leading-end portion 17 is not perfectly spherical-cap-shaped, but is substantially spherical-cap-shaped. For example, the leading-end portion 17 has a shape in which a low column is joined to the plane (bottom face) of a spherical cap. In any case, the lower face of the leading-end portion 17 is planar. That is the leading-end portion 17 has a planar portion 29.

In the protrusion 13, a leading-end face (upper face farthest from the support body) 31 in the height direction of the base portion 15 and the planar portion 29 of the leading-end portion are joined together. Note that the outer diameter of the leading-end portion 17, which is spherical-cap shaped, is larger in value than the outer diameter of the base portion 15, which is columnar in shape. The leading-end portion 17, which is spherical-cap shaped, is identical in central axis to the base portion 15, which is columnar in shape.

The substrate body 19 is, for example, tabular in shape. The through hole 21 of the substrate body 19 is, for example, pillar-shaped, such as columnar in shape, and passes through the substrate body 19 in the thickness direction thereof.

The protruded portion 23 is filmy in shape and covers, on the substrate body 19, the first face (upper face) 25 in the thickness direction of the substrate body 19. The substrate body 19 is identical in thickness direction to the protruded portion 23. The directions thereof are identical to the height direction. Note that a non-protruded region 33 provided with no protruded portion 23 is provided at part of the first face 25 in the thickness direction of the substrate body 19. When viewed in the thickness direction of the protruded portion 23 and the substrate body 19 (height direction), the non-protruded region 33 has a predetermined shape, such as a circle.

When viewed in the thickness direction of the protruded portion 23 and the substrate body 19, the center of the non-protruded region 33 is identical in position to the center of the through hole 21. The diameter (inner diameter) of the non-protruded region 33 is larger in value than the diameter (inner diameter) of the through hole 21.

In such an aspect in which the protruded portion 23 is filmy in shape as described above, the protruded portion 23 may be referred to as "filmy portion". However, because of the non-protruded region 33, the protruded portion 23 can be regarded as protruding upward from the substrate body 19. Thus, the protruded portion 23 may be allowed to be referred to as "protruded portion".

In the substrate support structure 1, a second face (lower face) 35 that is the other face in the thickness direction of the substrate body 19 is in face contact with the first face (upper face) 27 of the support body 11, and the support body 11 is identical in thickness direction to the substrate body 19.

In the substrate support structure 1, the planar portion 29 circularly annular in shape of the leading-end portion 17 of the protrusion 13 is in face contact with the first face 25 of the substrate body 19. More specifically, the planar portion 29 of the leading-end portion 17 is in face contact with the substrate body 19 exposed in the non-protruded region 33. Thus, in the thickness direction of the support body 11 and the substrate body 19 (height direction), the substrate 5 is interposed between the support body 11 and the leading-end portion 17 of the protrusion 13. Note that, in the interposition, for example, the substrate 5 is given urging force.

In the substrate support structure 1, the central axis of the through hole 21, the central axis of the protrusion 13, and the center of the non-protruded region 33 are identical to each other. The diameter (inner diameter) of the through hole 21 is larger in value than the diameter (outer diameter) of the base portion 15 of the protrusion 13 and is smaller in value than the diameter (outer diameter) of the leading-end portion 17 of the protrusion 13. Furthermore, the outer diameter of the leading-end portion 17 of the protrusion 13 is identical in value to the inner diameter of the non-protruded region 33, and thus the leading-end portion 17 fits in the non-protruded region 33. Furthermore, the entire of the outer circumference of the leading-end portion 17 of the protrusion 13 is in contact with the entire of the inner circumference of the non-protruded region 33.

In the substrate support structure 1, the leading-end portion 17 of the protrusion 13 slightly protrudes upward above the protruded portion 23 in the height direction of the substrate body 19. However, the leading-end portion 17 may be flush with the protruded portion 23 or the leading-end portion 17 may be recessed downward below the protruded portion 23.

The substrate 5 is thinly tabular in shape, having flexibility. For example, the substrate 5 is achieved with a printed wiring board, such as a flexible printed circuit (FPC) board. In the substrate support structure 1, as described above, the second face 35 of the substrate body 19 is in contact with the first face 27 of the support body 11 from which the protrusion 13 of the support body 11 protrudes.

In the substrate support structure 1, the protruded portion 23 is achieved with a resist (resist film) 43 provided on the substrate body 19 or a coverlay provided on the substrate body 19.

Next, a method of forming the substrate support structure 1 will be described.

Figure 2C:
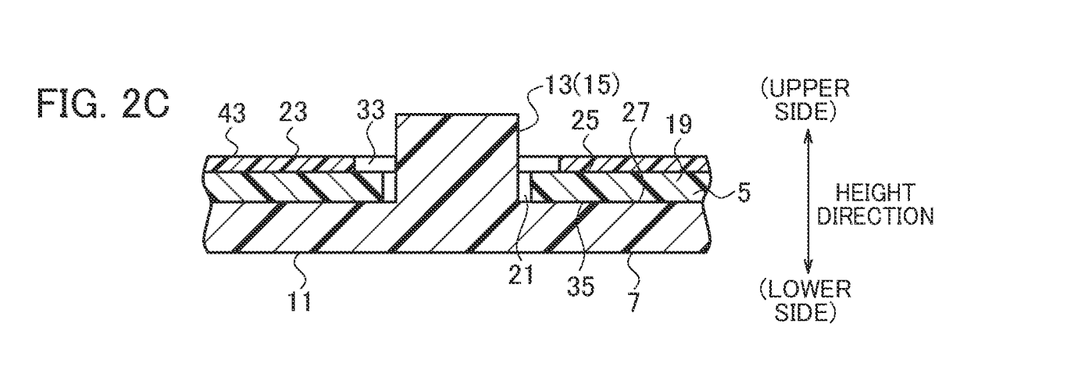
FIG. 2C corresponds to FIG. 2B and illustrates a protrusion before caulking.

First, as illustrated in FIG. 2C, the substrate 5 is temporarily fixed to the substrate support 7. In the temporary fixing, the protrusion 13 is columnar in shape and passes in the height direction through the through hole 21 of the substrate body 19. The second face 35 of the substrate body 19 is in contact with the first face 27 of the support body 11.

Next, the leading end of the protrusion 13 is softened, for example, by melting and then is hardened, so that the leading-end portion 17 is formed due to the deformation (refer to FIG. 2B). That is the leading end of the protrusion 13 is caulked by heat, resulting in formation of the leading-end portion 17. Thus, the substrate 5 is integrally fixed to the substrate support 7.

According to the substrate support structure 1, the substrate body 19 is provided with the protruded portion 23 surrounding the leading-end portion 17 of the protrusion 13 of the substrate support 7. Thus, even when the leading end of the protrusion 13 is melted at the time of formation of the leading-end portion 17 of the protrusion 13, the melted leading end is dammed by the protruded portion 23.

Thus, the leading end of the protrusion 13 softened due to melting can be prevented from spreading unnecessarily on the first face 25 of the substrate 5, so that, for example, the wiring pattern and the electronic components 9 provided on the substrate 5 can be protected against adverse influence.

Figure 6A:
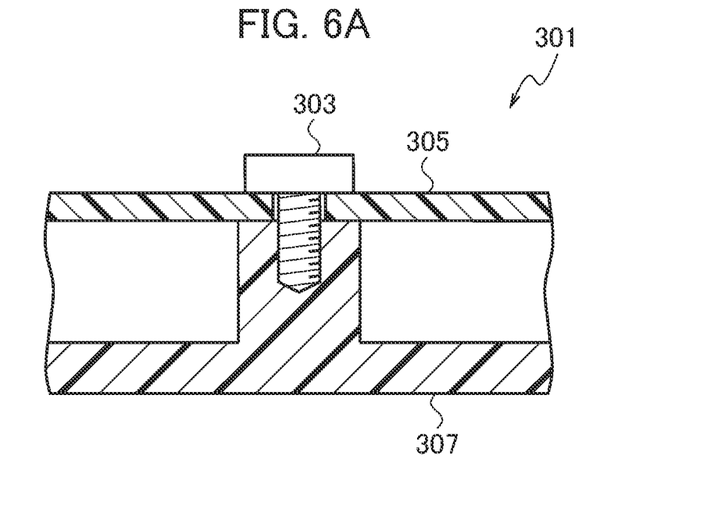
FIGS. 6A and 6B each illustrate a substrate support structure according to a comparative example.

In contrast to this, in a substrate support structure 301 according to a comparative example illustrated in FIG. 6A, a substrate 305 is fixed to a substrate support 307 with a screw (bolt) 303. Therefore, in a case where the substrate 305 is, for example, a flexible printed circuit (FPC) board, having flexibility, rotation of the screw 303 is likely to cause the substrate 305 to be entangled with the screw 303, resulting in deformation or damage.

Figure 6B:
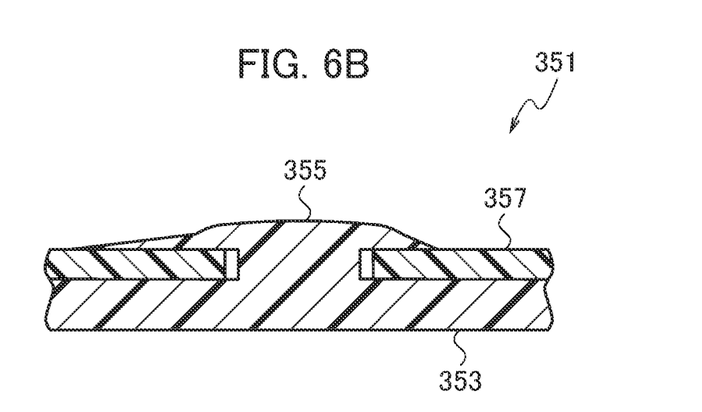

In a substrate support structure 351 according to another comparative example illustrated in FIG. 6B, the leading end of a protrusion 355 provided at a substrate support 353 is caulked by application of heat, so that a substrate 357 is fixed to the substrate support 353.

The substrate support structure 351 according to the another comparative example does not have such a protruded portion as the protruded portion 23 in the substrate support structure 1 according to the embodiment of the present application. Thus, the leading end of the protrusion 355 melted due to heat spreads unnecessarily on the surface of the substrate 357.

In the substrate support structure 1, the protrusion 13 of the support body 11 is caulked by heat, so that the substrate 5 is fixed to the substrate support 7. Therefore, at the time of fixing of the substrate 5 to the substrate support 7, almost no external force is applied to the substrate 5. Thus, even in a case where the substrate 5 is, for example, a flexible printed circuit board, being thinly tabular in shape and having flexibility, no damage is likely to occur.

In the substrate support structure 1, because the second face 35 of the substrate body 19 is in contact with the first face 27 of the support body 11, the substrate 5, which is flexible and is fixed to the substrate support 7, can be inhibited from deforming, as much as possible.

In the substrate support structure 1, the protruded portion 23 is achieved with the resist or the coverlay. Thus, there is no need to provide a process of forming the protruded portion, so that the manufacturing process can be simplified.

In the substrate support structure 1, a recess 37 may be provided as indicated with a chain double-dashed line in FIG. 2B. The recess is provided at the center of the leading-end portion 17 and is recessed downward from the upper face of the leading-end portion 17. Provision of the recess 37 enables saving of material necessary for formation of the leading-end portion 17.

Figure 3A:
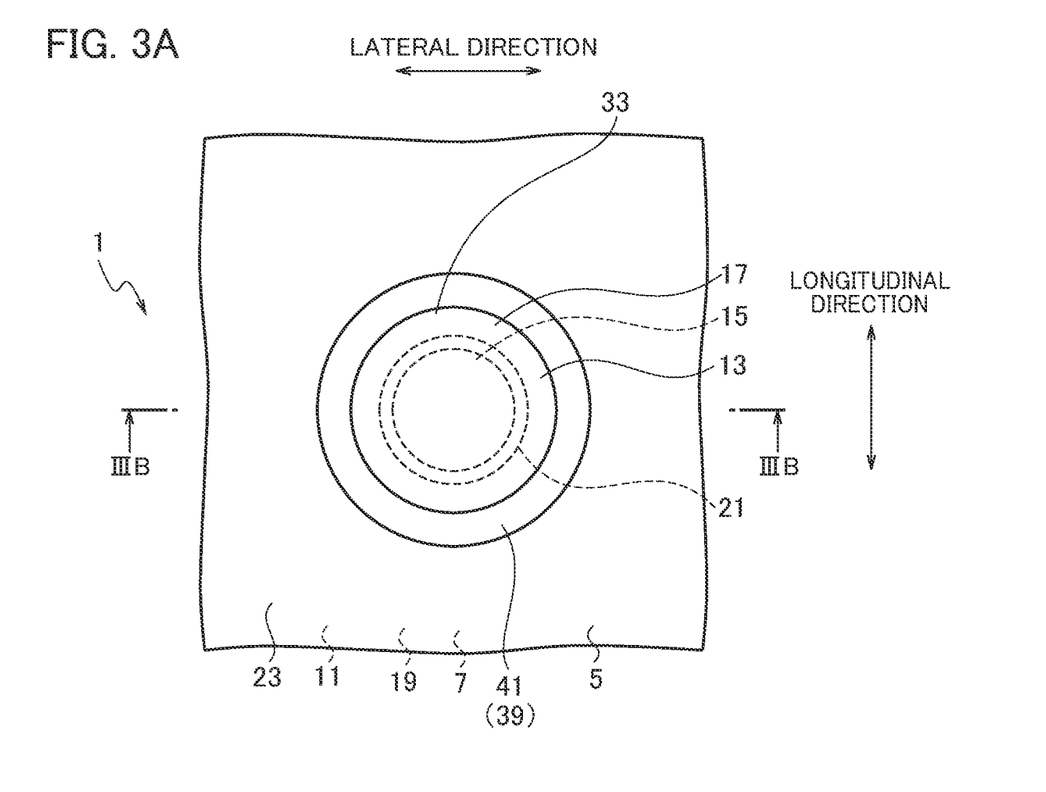
FIG. 3A corresponds to FIG. 2A and illustrates a substrate support structure according to a first modification.
Figure 3B:
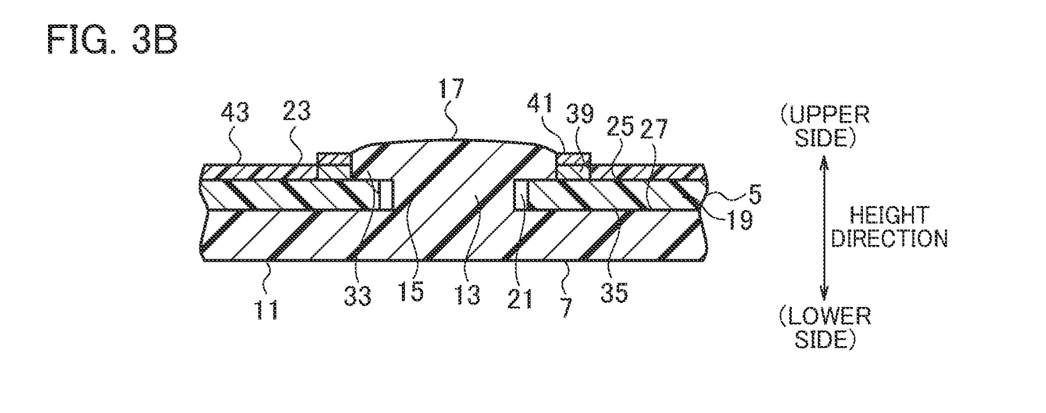
FIG. 3B is a sectional view taken along line IIIB-IIIB of FIG. 3A.

Note that, in the substrate support structure 1, as illustrated in FIGS. 3A and 3B, the protruded portion 23 may be achieved with part 39 of the wiring pattern provided on the first face 25 of the substrate body 19. This arrangement enables simplification of the manufacturing process without a process of forming the protruded portion 23.

The part 39 of the wiring pattern as the protruded portion 23 is, for example, annular in shape, such as circularly annular in shape, and slightly protrudes upward from the first face 25 of the substrate body 19. Achievement of the protruded portion 23 with such a wiring pattern leads to an aspect in which the protruded portion 23 protruding upward from the upper face of the substrate body 19 serves as a "protruded portion".

The part of the wiring pattern as the protruded portion 23 is not in connection with the other part of the wiring pattern that functions as a conductor for an electronic circuit. However, the part of the wiring pattern as the protruded portion 23 may be in connection with the other part of the wiring pattern that functions as a conductor for an electronic circuit.

In the substrate support structure 1, as illustrated in FIGS. 3A and 3B, the protruded portion 23 may be formed with the part 39 of the wiring pattern and solder 41. As described above, the part 39 of the wiring pattern is annular in shape, such as circularly annular in shape. Similarly, the solder 41 is annular in shape, such as circularly annular in shape. The part 39 of the wiring pattern is provided on the substrate body 19, and the solder 41 is provided on the part 39 of the wiring pattern. Because the solder 41 is provided such that the solder 41 overlaps the part 39 of the wiring pattern, the protruded portion 23 has an increase in the value of height. Note that a filmy object 43 illustrated in FIG. 3B is a resist.

Note that, in the aspect illustrated in FIG. 3B, the part 39 of the wiring pattern may be eliminated and the protruded portion 23 may be formed with the solder 41.

Figure 4A:
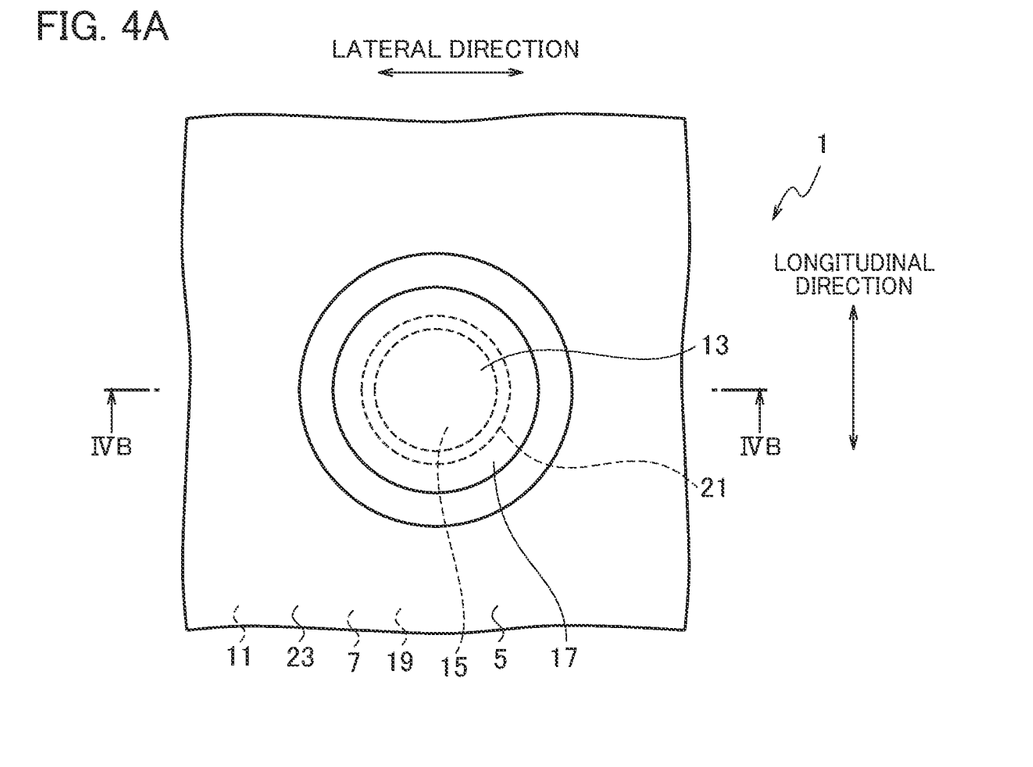
FIG. 4A corresponds to FIG. 2A and illustrates a substrate support structure according to a second modification.
Figure 4B:
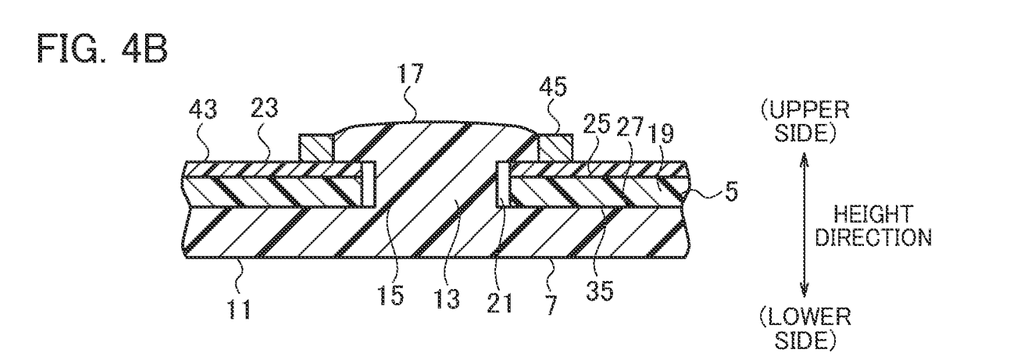
FIG. 4B is a sectional view taken along line IVB-IVB of FIG. 4A.

In the substrate support structure 1, as illustrated in FIGS. 4A and 4B, the protruded portion 23 may be formed with a ring-shaped member (e.g., a washer) 45 having a predetermined thickness. For example, through a glue or an adhesive such as a two-sided adhesive tape, the washer 45 is secured on the resist 43, which is filmy in shape, provided on the substrate body 19. Detachably provision of the washer 45 on the substrate 5 through an adhesive or the like enables easy removal of the washer 45 from the substrate 5 after formation of the leading-end portion 17 of the protrusion 13.

Achievement of the protruded portion 23 with the part 39 of the wiring pattern and the solder 41 or the washer 45 enables an easy increase in the value of protruded height (thickness) of the protruded portion 23. Then, the leading end of the protrusion 13 softened due to melting can be more reliably prevented from spreading unnecessarily on the surface of the substrate 5.

Note that, in the substrate support structure 1, the protruded portion 23 may be formed by any appropriate combination of the methods described with FIGS. 2A to 4B. That is the protruded portion 23 may be achieved with at least any of the solder 41 provided to the substrate body 19, the part 39 of the wiring pattern provided to the substrate body, and the washer 45 provided to the substrate body 19.

Figure 5A:
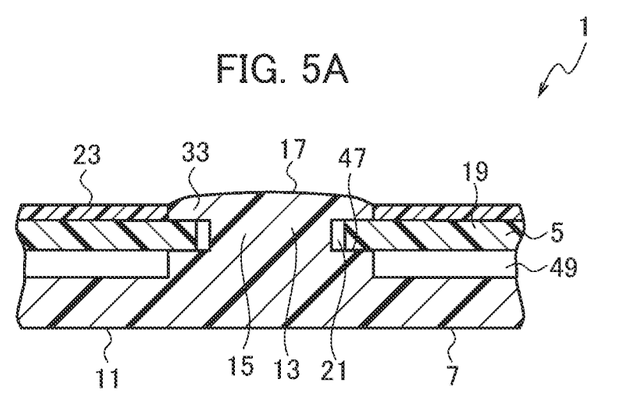
FIG. 5A corresponds to FIG. 2B and illustrates a substrate support structure according to a third modification.
Figure 5B:
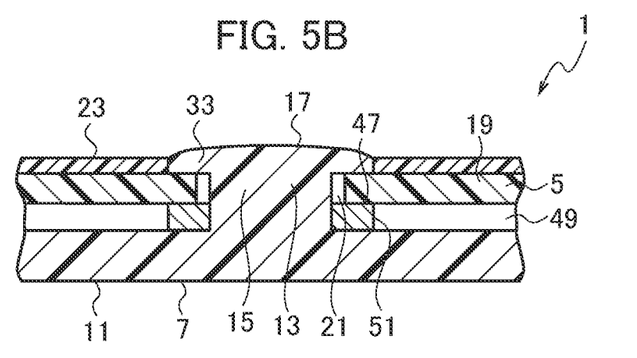
FIG. 5B corresponds to FIG. 2B and illustrates a substrate support structure according to fourth modification.

Note that, for the substrate support structure 1, either of the respective configurations illustrated in FIGS. 5A and 5B may be adopted.

In FIG. 5A, the protrusion 13 has an intermediate portion provided with a step portion 47. The substrate 5 abuts on the step portion 47 such that the substrate 5 is spaced apart from the support body 11 in the height direction. Thus, a space 49 is interposed between the substrate 5 and the support body 11.

In FIG. 5B, the step portion 47 is formed with a spacer 51 that is separate from the protrusion 13 and is tubular in shape, such as cylindrical in shape.

An aspect of usage of the substrate support structure 1 will be described now with reference to FIG. 1. Note that, for convenience of description, the height direction, the longitudinal direction, and the lateral direction are defined in FIG. 1. However, in an aspect of practical usage, the longitudinal direction is identical to the up-and-down direction (height direction). The description will be given with the directions along the aspect of practical usage.

The substrate (e.g., a flexible printed circuit (FPC) board) 5 is provided with a cell-voltage detection circuit unit (not illustrated) arranged on the upper side of a battery module 53 and the detection lines thereof, integrally. The substrate 5 is bent such that the substrate 5 is fixed along an end plate 55 (substrate support 7) of the battery module 53. One portion 57 segmented by the bent of the substrate 5 is fixed to the end plate 55 due to the substrate support structure 1.

The one portion 57 of the substrate 5 is equipped with tall components 59 among the circuit components. Thus, the battery module 53 can have a reduction in the value of height as a whole.

Note that the above description may be grasped as a method of forming the substrate support structure, the method including a substrate temporary fixing process and a protruding leading-end forming process (substrate fixing process). The substrate temporary fixing process is a process of temporarily fixing the substrate 5 to the substrate support 7. The protruding leading-end forming process is a process of thermally caulking the leading end of the protrusion 13 to form the leading-end portion 17.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate support structure comprising:
a substrate support including: a support body; and a protrusion including a base portion and a leading-end portion larger in outer diameter than the base portion, the protrusion protruding from the support body; and
a substrate having: a substrate body; a through hole provided at the substrate body; and a protruded portion surrounding the through hole, the protruded portion protruding from a first face that is one face in a thickness direction of the substrate body, wherein
the base portion of the protrusion passes through the through hole,
the leading-end portion of the protrusion protrudes from the first face of the substrate body inside the protruded portion, abuts the protruded portion, and engages with the substrate body such that the through hole is covered,
a portion of the first face, extended from the through hole to the protruded portion, is exposed by the protruded portion,
the portion of the first face is concentric with the through hole and with the protrusion, and
an entirety of the portion of the first face is covered by the leading-end portion of the protrusion.

2. The substrate support structure according to claim 1, wherein the substrate is thinly tabular in shape and has flexibility.

3. The substrate support structure according to claim 2, wherein a second face that is another face in the thickness direction of the substrate body is in contact with a face of the support body from which the protrusion protrudes.

4. The substrate support structure according to claim 1, wherein the protruded portion is formed of at least any of a resist provided to the substrate body, a coverlay provided to the substrate body, solder provided to the substrate body, part of a wiring pattern provided to the substrate body, and a washer provided to the substrate body.

* * * * *